US006801438B1

United States Patent
Castro (10) Patent No.: US 6,801,438 B1
(45) Date of Patent: Oct. 5, 2004

(54) ELECTRICAL CIRCUIT AND METHOD OF FORMATION

(75) Inventor: Abram M. Castro, Fort Worth, TX (US)

(73) Assignee: Touch Future Technolocy Ltd. (HK)

( * ) Notice: Subject to any disclaimer, the term of this patent is extended or adjusted under 35 U.S.C. 154(b) by 243 days.

(21) Appl. No.: 09/695,353

(22) Filed: Oct. 24, 2000

(51) Int. Cl.[7] .................................................. H05K 1/16
(52) U.S. Cl. ...................... 361/765; 361/777; 174/260; 174/261
(58) Field of Search ................................. 361/775–777, 361/761, 762, 764, 772, 774, 783; 174/260, 261, 264, 265; 257/700, 723, 724

(56) References Cited

U.S. PATENT DOCUMENTS

| | | | | |
|---|---|---|---|---|
| 5,227,839 A | | 7/1993 | Allen ........................... 355/53 |
| 5,327,338 A | | 7/1994 | Allen et al. .................. 346/108 |
| 5,386,221 A | | 1/1995 | Allen et al. .................. 346/108 |
| 5,536,909 A | * | 7/1996 | DiStefano et al. ........... 174/261 |
| 5,599,747 A | * | 2/1997 | Bhatt et al. .................. 437/209 |
| 5,726,075 A | * | 3/1998 | Farnworth et al. ............. 438/18 |
| 5,757,469 A | | 5/1998 | Allen ........................... 355/53 |
| 5,812,571 A | | 9/1998 | Peters .......................... 372/36 |
| 5,872,338 A | * | 2/1999 | Lan et al. .................... 174/255 |
| 6,107,683 A | | 8/2000 | Castro et al. ................ 257/700 |
| 6,130,111 A | | 10/2000 | Ikuina et al. ................ 438/106 |
| 6,160,714 A | * | 12/2000 | Green ......................... 361/761 |
| 6,323,065 B1 | * | 11/2001 | Karnezos .................... 438/122 |
| 6,329,605 B1 | * | 12/2001 | Beroz et al. ................. 174/256 |

* cited by examiner

*Primary Examiner*—David Martin
*Assistant Examiner*—Thanh S. Phan
(74) *Attorney, Agent, or Firm*—Philip G. Meyers (57) ABSTRACT

A process for forming a circuit pattern on a substrate includes steps of forming a number of electrical circuits on a substrate, which circuits include an electrically conductive bus that interconnects the circuits, covering the electrical circuits with a soldermask, leaving electrical contact portions exposed, electroplating the exposed electrical contacts with a conductive surface finish by using the bus to electrolytically apply the surface finish, and then severing the bus at locations between circuits so that the circuits are electrically isolated from each other. The process may be used to make circuit boards and especially integrated circuit packages.

10 Claims, 7 Drawing Sheets

ELECTRICAL CIRCUIT AND METHOD OF FORMATION

TECHNICAL FIELD

The present invention relates to circuit boards and integrated circuit packages and, more particularly, to method for making electrical circuits on circuit board or integrated circuit packages.

BACKGROUND OF THE INVENTION

Electroplating technology has been around for over 50 years, providing circuit board designers and fabricators a controlled, highly reliable, and cost effective means of applying a surface finish to the board. In most electroplating schemes, a power source (rectifier) is electrically connected to an anode bar that is in turn connected to either bars of the desired metal finish, or baskets containing balls or nuggets of the desired metal finish. The metal bars or nuggets provide a source for the metallic ions of the required finish. The source is then submersed in an electrolytic solution of a similar metallic nature that provides a conductive path for the ions. To an opposite bar, the cathode is attached to the negative or return path of the power source (rectifier). Electrically attached to the cathode is the work piece, or circuit board, that requires the plating deposit and in turn is also submersed in the conductive electrolytic solution. When a voltage is applied across the anode and cathode, the metal ions move from the solution to the cathode, and deposit on the work piece surface, and the ions in turn replenished by the anode source. Of course, in order to be electroplated, all circuit networks on the work surface (circuit board) must provide a continuous path to the cathode bar. Thus, any circuit not connected to this path will go un-plated. Electroplating technology is well understood by those skilled in the art and its methodologies are well documented.

For most printed circuit manufacturing flows utilizing electroplating technology, the circuit board is designed in such a way as to independently connect each electrical network on the circuit to an external bus bar that is then connected to a perimeter bus, which is then in turn connected to the cathode. Using this technique allows fabricators to form the circuit layer independently of considering future bussing requirements. Thus, in a typical flow, the circuit board is processed through an 'etching' procedure that electrically isolates one network from the next, forming a functional circuit board. Since each network is independently connected to the bus, a protective coating such as soldermask can be applied over the entire circuit board without consideration for future bus requirements. In turn, a final finish can be electroplated onto the circuit (selectively applied onto areas where the soldermask is designed to be clear) by conventional electroplating described above. Once the electroplating operation is complete, the circuit card or board can be singulated from the panel, with each circuit network regaining its independence by mechanically cutting off the common bus, and thus becoming a functional circuit board. This technique is well understood by those skilled in the art.

When an electrical path is not available to all the circuit networks that require a surface finish, often a process known as electroless plating is used. In this method, the plating solution provides its own ions for deposit on the submersed work area. A variety of techniques are used to augment the metallic deposition process, including the use of catalysts, high temperature baths, and reducing agents. For some types of metallic deposits, the electroless technology used has proven very reliable. An example of this is the electroless copper process used to fabricate printed circuit boards. For metal surface finishes used in circuit board processes, however, the electroless methodologies have proved costly and unreliable. An example is the electroless deposit of nickel followed by the electroless deposit of gold in substrate integrated circuit (IC) packaging applications. These nickel deposits typically use phosphorous as a reducing agent that co-deposits along with the nickel and results in undesirable inter-metallic alloys when combined with eutectic solder. In addition, the electroless deposit of some metal finishes including nickel and gold takes considerably longer than deposits of the same metals using an electroplating technology. The transition to these electroless processes has been dictated primarily by geometric constraints imposed by the fine features typically found in very dense circuit boards including IC packages.

As circuit density increases, the number of available paths to 'route' or lay out the board in such a manner as to connect everything to the electrical bus becomes limited. Manufacturers are pushing towards miniaturization, which places routing room on a circuit board or substrate for IC packaging at a premium. For some designs operating at high frequencies, the need to bus is further compromised by the electrical performance of the circuit. The termination of a circuit network at a desired point is compromised by the need to connect the network to the electrical plating bus. This extension of the circuit line creates undesired attenuation in the circuit, which is especially noticeable in designs operating at speeds of over 500 Mhz. Often the reliability of electroplating technology is sacrificed to obtain the final electrical performance of the circuit.

Castro et al U.S. Pat. No. 6,107,683, issued Aug. 22, 2000 describes a process for making a ball grid array substrate package wherein a seed layer is formed by electroless plating of a seed layer that is used as a bussing mechanism to electrolytically form the circuit pattern. Nickel-gold plating 231A, 231B for the wire bond pads is applied electrolytically using by means of a conductive layer 218 which performs as a bus as shown in FIG. 2h of the patent. Layer 218 is then removed in a differential etch process (FIG. 2i of the patent) which however creates the risk of contaminating the Ni-Au contacts. The present invention seeks to address this disadvantage.

SUMMARY OF THE INVENTION

A process according to the invention addresses the growing need for applying stable electroplating met hodologies to very dense circuit designs. The method of the invention incorporates a selective laser ablation step and a structure that can be processed in a manner entirely consistent with existing printed circuit board manufacturing requirements. Electrical performance of the circuit is enhanced by not only the novel structure, but also by the ability to incorporate greater circuit densities and isolation lines. The technique is particularly useful in IC packaging applications including ball grid, land grid, or pin grid array formats, but can also be customized to suit a variety of end user applications such as circuit boards.

According to one aspect of the invention, a method for electroplating a substrate with a circuit pattern includes the steps of:

forming a number of electrical circuits on a substrate, which circuits include an electrically conductive bus that interconnects the circuits;

covering the electrical circuits with a soldermask, leaving electrical contact portions exposed;

electroplating the exposed electrical contacts with a conductive surface finish by using the bus to electrolytically apply the surface finish; and then severing the bus at locations between circuits so that the circuits are electrically isolated from each other.

A circuit board made according to this process will bear the remnant of the electrically conductive shorting bus, generally a closed path or ring intersecting each of the circuits that has been severed at a location between each circuit. Otherwise the circuit will generally resemble known circuit boards or integrated circuit substrates. The severing operation can be carried out using a precision laser to either cut the electrically conductive shorting portion directly, or cut a soldermask layer over it so that exposed portions of the electrically conductive shorting portion can be removed by chemical etching. Where nickel-gold is used as the contact surface finish, the method of the invention can reduce gold consumption up to 70%.

According to a further aspect of the invention, a process of forming an integrated circuit package, includes steps of:

forming a dielectric layer on one surface of a substrate;

forming a number of electrical circuits on the dielectric layer, which circuits include an electrically conductive bus that interconnects the circuits;

covering the electrical circuits with a soldermask, leaving electrical contact portions exposed;

electroplating the exposed electrical contacts with a conductive surface finish by using the bus to electrolytically apply the surface finish;

severing the bus at locations between circuits so that the circuits are electrically isolated from each other;

mounting an integrated circuit die on the substrate; and connecting the integrated circuit die to the surface finish of the electrical contacts.

The substrate and circuits are generally made of copper in such an IC package, whereas the preferred surface finish is successive layers of nickel and gold.

A circuit board according to the invention includes a substrate such as a copper plate or other substrates conventionally used to make circuit boards, a dielectric layer formed on a surface of the substrate, a number of electrical circuits formed on the dielectric layer, which circuits include an electrically conductive bus that interconnected the circuits, which bus has been severed forming cuts at locations sufficient to electrically isolate the electrical circuits from one another, and a soldermask covering the electrical circuits but leaving electrical contact portions thereof exposed, the contact portions having a surface finish deposited thereon. These and other aspects of the invention are described further in the detailed description that follows.

BRIEF DESCRIPTION OF THE DRAWINGS

A more complete understanding of the invention may be had by reference to the following detailed description when taken in conjunction with the accompanying drawings, wherein.

DETAILED DESCRIPTION

For the new electroplating technique according to the invention, the process begins at the CAD (computer aided design) or CAM (computer aided manufacturing) segment of the design cycle. The process for fabricating a circuit board or IC package generally begins with a design for the circuit either submitted by the customer or generated internally by the fabricator. The submitted design incorporates an electrical net list that details each of the beginning and termination points on every circuit network. Because most fabrication technologies have some variance in process technology, these designs (CAD designs) are typically reviewed during a CAM process that allows the fabricator to massage the design and optimize for a successful manufacturing process. In a typical CAM process used in most circuit board manufacturing operations, the minor adjustments made to the design include modification of the circuit line widths and spaces to meet manufacturing tolerances, increased clearances, and panelization, or the art of combining different circuit cards onto one panel to improve efficiency in the manufacturing process, wherein the cards are to be singulated from the panel either by the fabricator or assembler at the end of the process. It is at this point that typically the ability to bus or electrically connect the independent circuit networks together is determined. The factors that influence the decision on the ability to bus or not bus include the fabricator's capability of forming geometric features small enough to route out each independent circuit network, the electrical performance effects of the additional bussing network, and the process flow capabilities of the fabricator. For reliability and cost reasons, it is generally accepted that the most exotic surface finishes, including the deposit of nickel, gold, silver, and palladium, are best achieved through electroplating operations.

These surface finishes (nickel, gold, silver, and palladium) are typically used in micro-electronic applications, often referred to as IC packages or chip carriers. These are very dense, small form factor circuit boards that generally interface directly with an integrated circuit (IC) die. The IC's, composed of millions of transistors, hold most of the value in any electronic assembly. As such, they are quite sensitive to environmental conditions, operating parameters, and most important, the interface conditions of the interposing IC package.

The electrical connection from the die to the IC package is created via wire bonding or flip chip technology, which provide an electrical path from the die to the IC package that can then be connected to and routed on the systems card. The interface of choice for this application is wire-bondable gold plated over a nickel base. The fine geometric nature, miniaturized footprints, and stringent electrical performance requirements of these microelectronic circuits often limits the ability to route each independent network to a plating bus. Although the method of choice for applying the required surface finish is electroplating, the process is compromised due to this inability to route, and thus the fabricator is limited to one of two options—either use electroless deposition, or plate the surface finish before the independent circuit networks are 'etched' in order to use the common copper foil as a bus mechanism. The electroless plating process has been described above.

In order to apply a surface finish before the final etching of the circuit networks, a bus mechanism can be obtained by using the common copper foil (or alternate metallic base) that the circuits are built onto. Circuit board materials are composed of conductive metal layers (e.g., copper) separated by insulating dielectrics (typically epoxies) that form the backbone of the fabrication process. For double-sided processes, the copper clad layers are drilled, plated, then circuits are etched into the foil to achieve the desired patterns. For multilayer boards, etched patterns are laminated together and then drilled in order to achieve electrical interconnect between layers. These materials and processes are well understood and documented by those familiar in the art.

Often, when a bus mechanism cannot be achieved, the copper layer of the base material is used as a common bus. In this process, the exterior layer that requires a surface finish is coated with a removable resist, the desired image is patterned, and the circuit is electroplated with the finish using known methodologies. After plating, the temporary resist is removed, exposing the base copper below, and the independent networks are isolated by chemically etching away the exposed copper base. The limitations of this process include higher costs due to the deposition of metal finish over greater surface areas, the potential contamination of said surface finish by subsequent processes (including soldermask), and the greater sensitivity of the surface finish to handling damage by subsequent processes, including singulation. Thus, although viable, the process of applying surface finish with electroplating methods mid-process is not an ideal option.

The method of the invention eliminates the need for electroless or mid-process electroplating deposition of the surface finish by providing a bus mechanism that will later be removed or exposed for removal by laser technology. During the computer aided manufacturing (CAM) design process, a shorting mechanism or multiple shorting mechanisms are added to the desired net list in order to provide a common bus for the electroplating operation. A short removal pattern (trim line) is also generated that will be used to isolate the circuit networks one from another during the laser trim operation.

The application of the shorting mechanism(s) is made to the computerized design after an analysis of the desired design and its electrical performance helps dictate the optimized location and efficiency of the shorting placement. For example, when used in IC packaging applications, an optimized location for the shorting ring would entail placement of the shorting pattern inside of the 'resin dam' or encapsulating perimeter in order to cover the trim line with epoxy, and placement of the trim line would be optimized by placing it as close to the circuit as possible in order to minimize electrical noise. Since almost every circuit design is customized, it would be difficult to set CAM rules for every possible design iteration. In consequence, each fabricator and circuit designer will generate independent sets of rules optimized for their end use and application.

Once the shorting mechanism and trim-lines are established, the circuit board manufacturing process proceeds per standard flows. Many variations of a typical circuit board manufacturing flow are used by various fabricators, but a typical manufacturing flow can be described as follows:

(1) inner layers are imaged and etched onto copper clad dielectrics;
(2) the layers are laminated together;
(3) mechanical vias are formed and plated to connecting the layers together;
(4) the outermost layer is imaged and etched;
(5) a soldermask is applied as a protective coating;
(6) an electrically conductive surface finish is applied to the electrical contacts; and
(7) the individual circuit cards are singulated from the panel in which they were run, tested and ready for electronic assembly.

This method and its variations are well known. According to the present invention, when the photo-tools (mylar or glass masks containing the circuit pattern) or electronic design files are prepared for the outer layer image step, they are generated with the shorting mechanisms added during the CAM process. When the outer layer is imaged and etched, every circuit network requiring the electroplated surface finish is 'shorted' together by design. These shorted networks can subsequently ready be tied to an external electrical path for the electroplating operation.

Figure 1:
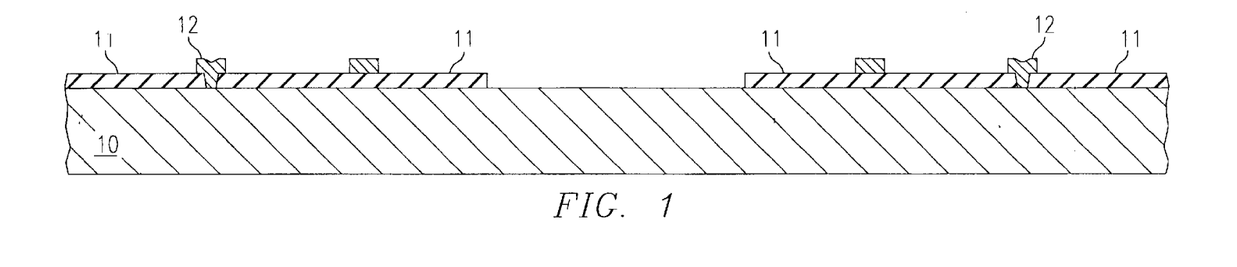
FIGS. 1 to 5 are partial cross sectional views showing a substrate according to the invention in successive stages of completion.

FIGS. 1–11 illustrate one form of preferred IC substrate package build-up process according to the invention. The process starts with a step of material preparation of a conductive metal core or substrate 10 which may include surface roughening to improve adhesion of the dielectric layer. This roughening treatment is described in Castro et al. U.S. Pat. No. 6,107,683, issued Aug. 22, 2000, the contents of which are incorporated by reference herein for all purposes. A dielectric layer 11 is coated onto the roughened top surface of substrate 10. A pattern including a central cavity and vias is imaged onto the dielectric layer, and the dielectric layer is developed out to form the cavity and vias. A layer of copper 12 is then formed in a plating step, first applying a thin conductive layer of copper by electroless plating, and then by using the coating as a bus to form the rest of the copper layer electrolytically. In subsequent print, etch and cure processing, a temporary resist is coated on top of the copper layer 12, then imaged and developed. The etching process then removes copper from the exposed areas to leave behind the circuit pattern. The resist is then stripped off, resulting in an intermediate inner circuit layer structure as shown in FIG. 1.

Figure 2:
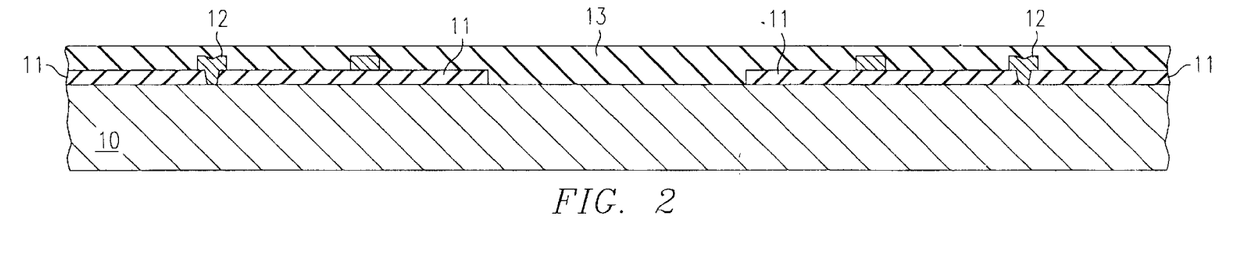
Figure 3:
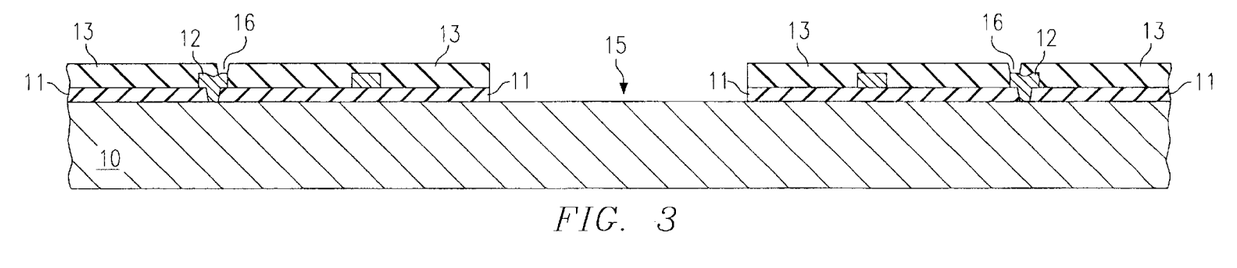
Figure 4:
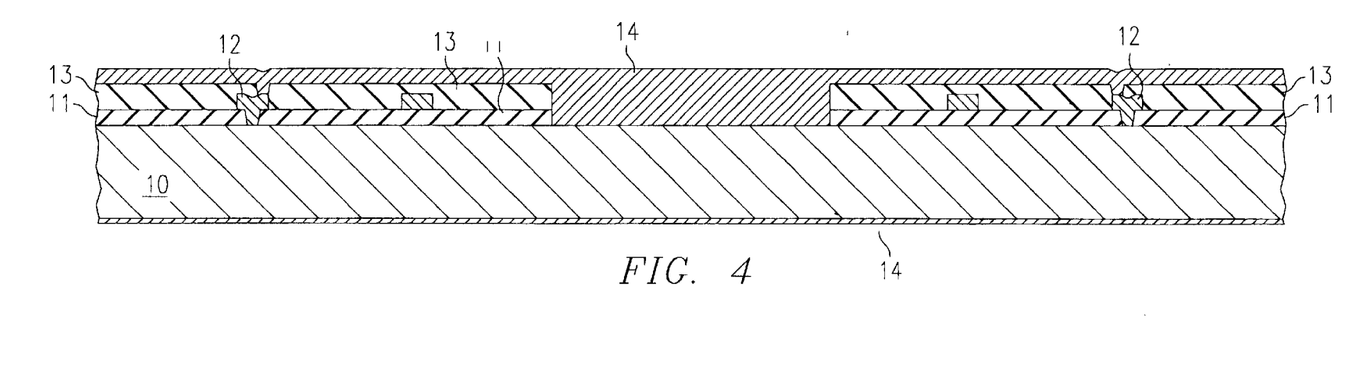
Figure 5:
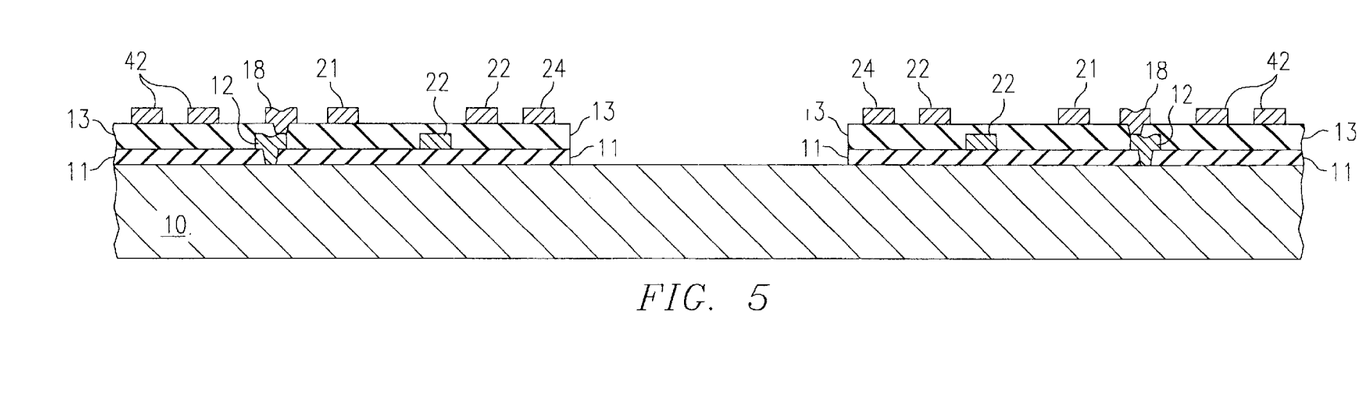
Figure 10:
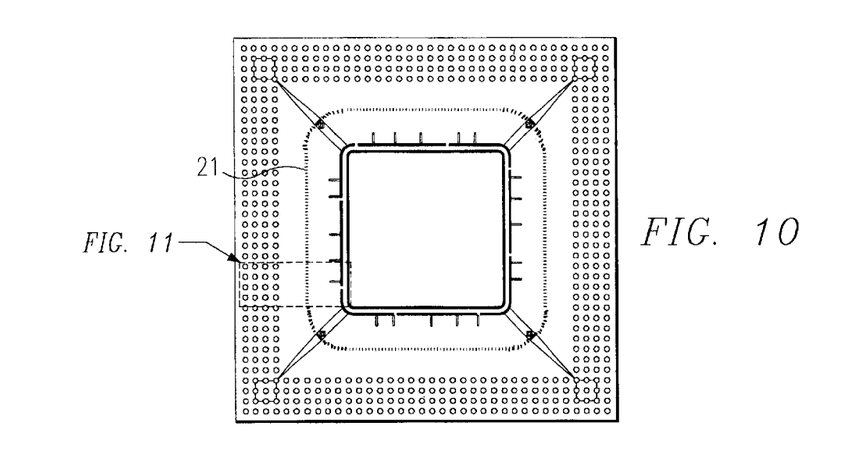
FIG. 10 is a top view of a singulated substrate according to the invention.
Figure 11:
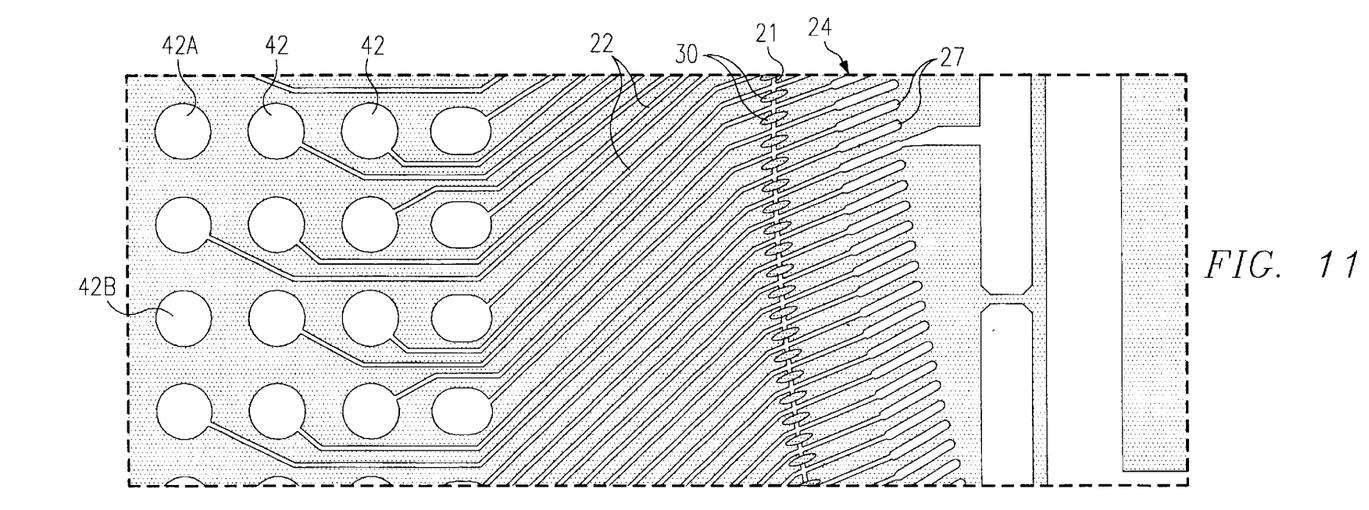
FIG. 11 is an enlarged view of the boxed area of FIG. 10.
Figure 12:
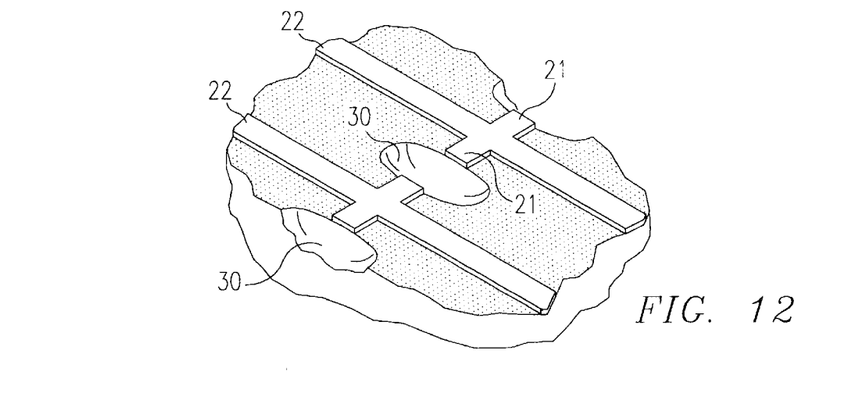
FIG. 12 is an enlarged perspective view of the cuts shown in FIG. 11.

A further dielectric layer 13 is then formed over the first circuit layer 12 as shown in FIG. 2. It is imaged and developed to form a further pattern including central cavity 15 and vias 16 as shown in FIG. 3. Copper is then plated over dielectric layer 13, again by electroless deposition of a seed Cu layer followed by electrolytic plating (FIG. 4). Once again, print, etch and cure steps are carried out to form a second copper circuit layer 14 as shown in FIG. 5. At locations where a ground connection 18 is needed, layer 14 is deposited directly onto layer 12, generally at a slightly offset position as shown. A conductive ring 21 is formed as part of outer copper layer 14. As best illustrated in FIGS. 10–12, ring 21 unites all of the exposed copper circuits 22 and acts as a bus during further processing.

At this stage, further processing may follow one of three variations depending on the desired results. In variation A, a soldermask layer 23 is formed over the circuits 22, leaving ring 21, inner bonding pads 24 and outer ball pads 42 clear.

Figure 6A:
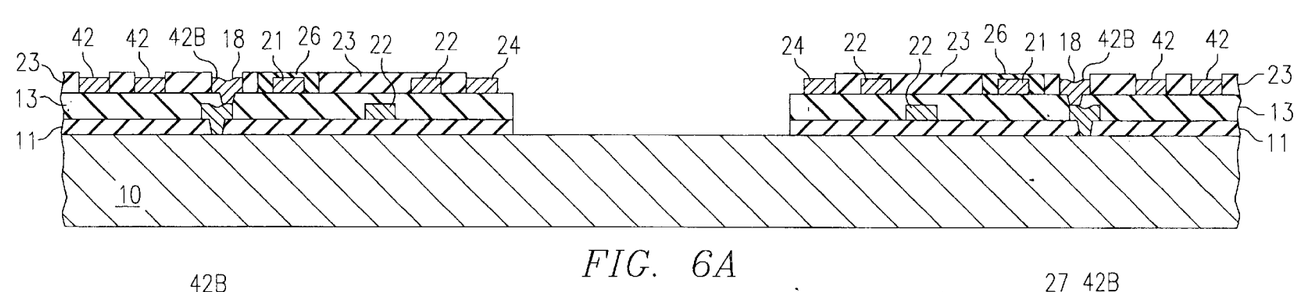
FIGS. 6A, 7A and 8A represent continued processing of the substrate of FIGS. 1–5 according to a first variation of the process of the invention.
Figure 7A:
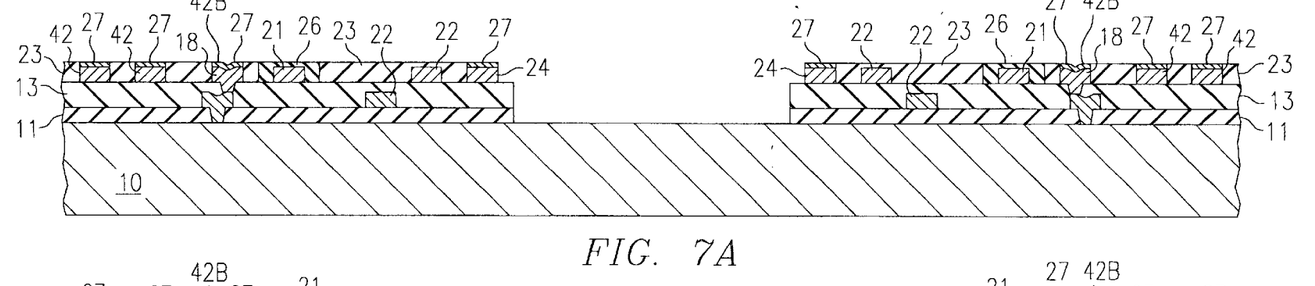
Figure 8A:
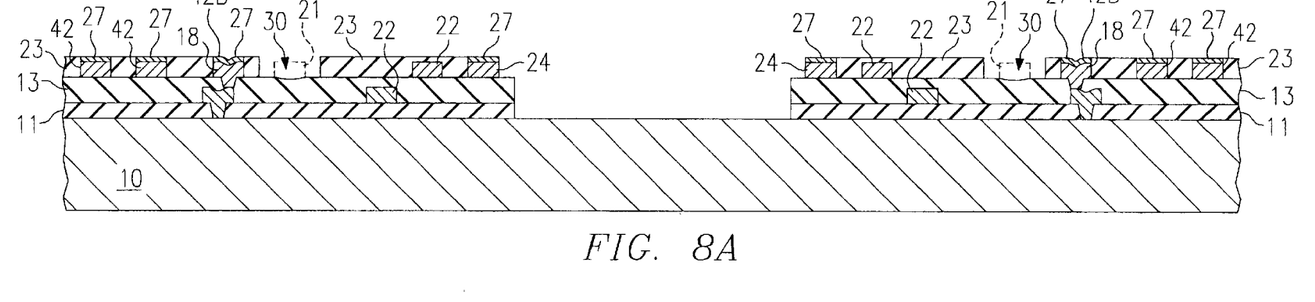

A temporary resist layer 26 is then coated over ring 21 as shown in FIG. 6A, leaving bonding pads 24, 42 exposed. Pads 24 are then electroplated with nickel/gold as is known in the art to form electrodes 27 as shown in FIG. 7A. During this step, ring 21 is used as a bus so that electrodes 27 can be electrolytically formed. The temporary resist layer 26 is then removed, leaving ring 21 exposed. At this point, ring 21 is laser trimmed as shown in FIG. 8A at locations between each circuit 22, so that each circuit 22 is electrically isolated from each other circuit 22. This results in a series of cuts 30 in ring 21 as shown in FIGS. 11–12. The laser trimming process is further described hereafter. This first version of the process has two disadvantages relative to the other versions described below: (1) removal of the temporary resist after the formation of the Ni/Au layer increases the chance of contamination of the Ni/Au layer, and (2) direct ablation of the ring requires more energy and time than chemical removal.

Figure 6B:
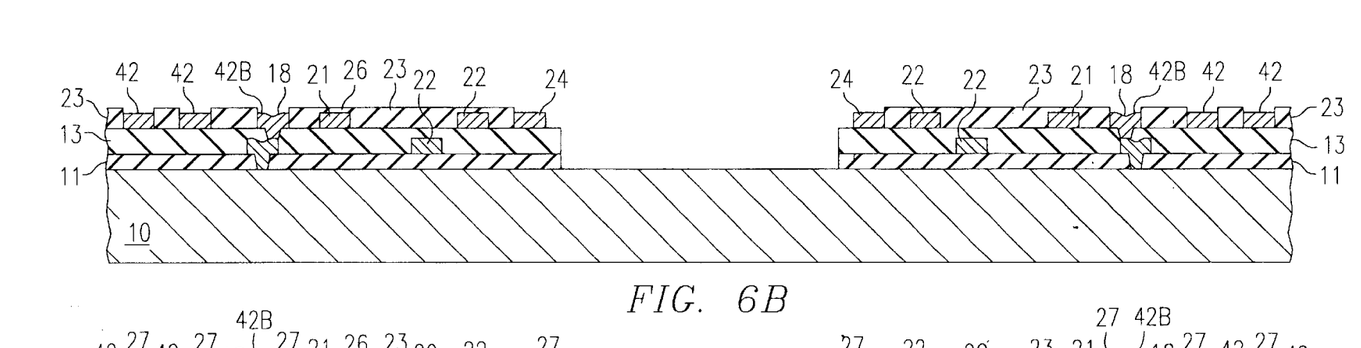
FIGS. 6B, 7B and 8B represent continued processing of the substrate of FIGS. 1–5 according to a second variation of the process of the invention.
Figure 7B:
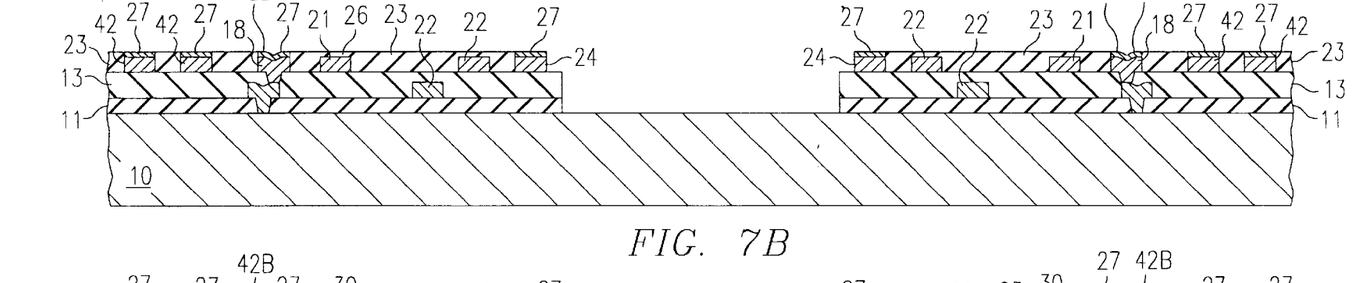
Figure 8B:
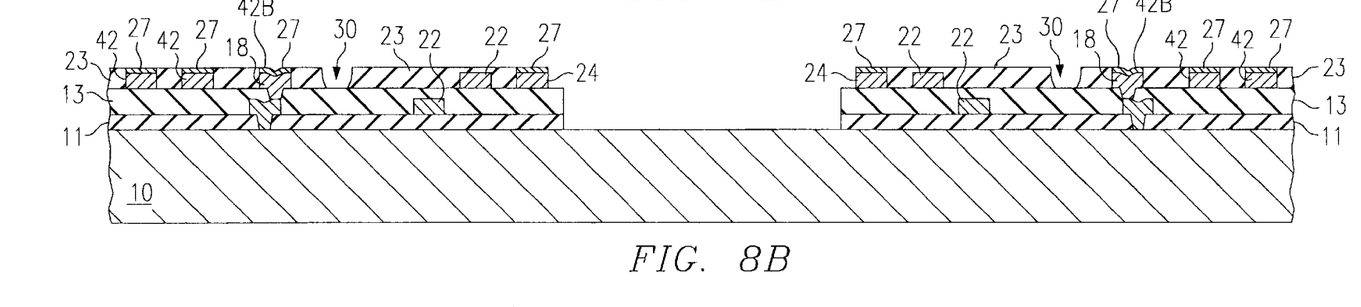

In a second variation B, soldermask layer 23 is formed over both circuits 22 and ring 21, with bonding pads 24, 42 clear (FIG. 6B). Pads 24 are then electroplated with nickel/gold to form electrodes 27, again using ring 21 as a bus (FIG. 7B). At this stage, the laser is then used at a power level and burn time as needed to ablate the soldermask 23 only at the positions where the cuts in ring 21 are to occur. Ring 21 is then chemically etched to selectively remove the soldermask 23 at the locations of the cuts 30 (FIG. 8B). For this purpose, a thickness of 0.6 mil is preferred for ring 21, and the exposed copper of ring 21 may be oxide-treated in the same manner as the cavity so that the degree of surface oxidation is uniform. The etchant used in this step attacks the copper but not the nickel-gold contacts. This version of the process reduces the time and energy used in laser trimming, but the etching step after the Ni/Au layers have been formed increases the risk of contamination.

A third variation C is the same as B until the step of severing the copper shorting ring 21. The laser cuts simultaneously through both soldermask 23 and ring 21 in order to isolate the circuits, effectively assuming a configuration similar to FIG. 8B in one step. This version of the process requires more laser cutting time and energy than variation B, but the risk of contamination of the Ni/Au contacts is minimal, and thus this version of the method may be most useful for jobs wherein the quality standards are very high.

Figure 9:
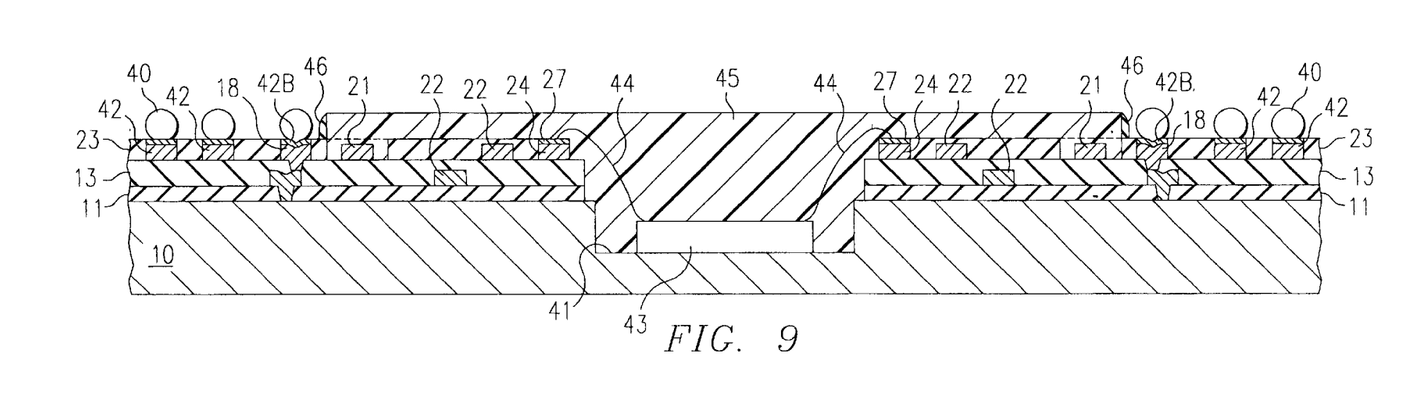
FIG. 9 represents the substrate of FIGS. 8A, 8B after completion by the user.

Once the ring has been severed, processing is completed by milling the die cavity 41 and singulating the substrates (cutting the strip), inspection and testing, washing, packaging and shipping. The substrate is now in a form usable when needed by the end user, who completes the final stages of the assembly process. Solder balls 40 are mounted on the corresponding pads 42, and a die 43 is mounted in the cavity and wire bonded to contacts 27 by wires 44 as shown in FIG. 9. The entire top surface including the remains of ring 21 is then sealed with a conventional encapsulant 45 retained by a perimeter dam 46.

FIGS. 10–12 show one favorable arrangement for ring 21. As shown, ring 21 is in the form of a rounded square intermediate the outer solder ball pads 42 and the row of Ni/Au plated contacts 27. Certain pads 42A may be unused, whereas others 42B may be connected directly to substrate 10 by means of Cu-filled vias 18. Preferably ring 21 is located close enough to die cavity 41 that it can be conveniently encapsulated at the same time as the die 43. Ball pads 42 in the foregoing embodiment are left uncovered during Ni/Au plating and are plated in the same manner as the wire bond pads. Alternatively, if no plating of pads 42 is desired, a temporary resist is applied and later removed in the same manner as described above for ring 42.

The foregoing embodiment is a two-layer structure with a pair of inner and outer copper layers which can each form separate electrical circuits 22. In general, where more than one circuit layer is formed, the shorting ring is formed on the outermost copper layer. If necessary, underlying circuits 22 can be connected to shorting ring 21 by providing copper filled vias at locations just below ring 21 at the points at which inner layer circuits 22 pass under ring 21. Cuts 30 remove ring 21 at a locations that exposes the underlying via.

Figure 13:
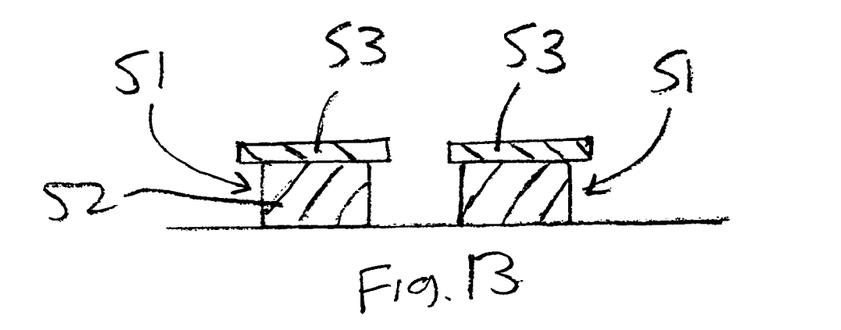
FIG. 13 is an end view of a conventional bond finger with a surface finish.
Figure 14:
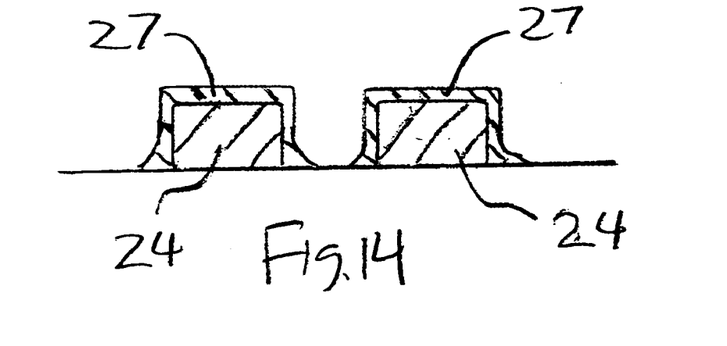
FIG. 14 is an end view of a bond finger with a surface finish according to the present invention.

The process of the invention also gives rise to an improved bond pad or finger structure. In a conventional process as shown in FIG. 13, the step of removing an organic resist after plating necessitates creating an undercut 51 on the sides of the bond pad 52 and beneath the Ni/Au plating layer 53. For bond pads or fingers 24 according to the invention as shown in FIG. 14, no such undercuts are created, and the sides 54 of each pad 24 are plated along with the top surface of pad 24, giving plating layer 27 an inverted U-shape in cross section. The resulting structure provides a more stable surface for wire bonding.

Since the circuit networks are etched in conjunction with the shorting ring or bars, no extra processing is required in order to bus the system together. If the device is to be entirely electroplated, then the process can be run as is. Alternately, if the design is to be selectively electroplated, soldermask is applied and used to form a plating resist pattern as in the foregoing example. For the example of use in IC substrates, using a soldermask as a plating resist is preferable for a number of reasons. First, using a soldermask reduces cost by limiting the amount of surface area to be electroplated. Most surface finishes (nickel, gold, palladium, silver) are precious metals that comprise a large percentage of the raw material costs. Second, using a soldermask as a plating resist also improves product reliability. In most instances, the soldermask will be applied as a protective coating over the circuits. It is generally understood by those skilled in the art that applying soldermask over a bare copper surface (SMOBC) gives a preferred adhesion advantage over applying soldermask over a noble metal finish. Third, an advantage can be seen in the performance of the surface finish. Since a soldermask will generally be applied regardless, the surface finish is less susceptible to contamination when applied after the application of the soldermask coating.

Whether or not soldermask is applied after the circuit etch process, the electroplating operation commences per standard procedure. At this point, the fabricator can decide whether to use the present invention to completely clear the designed metal short with the laser trim operation, or proceed with a trim of the protective mask and chemically clear the short. If the first option is chosen, then a temporary resist is applied over the short, but not covering the points to be plated. The purpose of this temporary soldermask is to cover the copper short and protect it from being plated by the required surface finish. Most laser technologies now employed, primarily YAG lasers, are frequency optimized for clearing shorts through copper. Adding a metal surface finish over this copper would reduce the efficiency of the trimming operation. A better temporary mask is an aqueous photo-definable epoxy acrylic similar to those used in primary image process described above, like those resists marketed by companies such as Dupont, Shipley Ronal, and Etertec. Once the conductive metal surface finish is deposited on the contacts or bonding pads, the circuit panel is ready for the laser trim operation.

Recent developments in laser technology have resulted in the development of numerous laser drilling and laser imaging technologies for use in the printed circuit industry. These lasers have been used for a number of years to achieve geometric features required by micro-vias. In these processes, the material (either epoxy or copper foil) can be burned away (ablated) or decomposed enough to be chemically developed away. To date, the focal point and inexact uniformity of these lasers has limited application to vias. However, companies like ESI and ETEC systems have recently introduced laser systems that are suitable for much finer via technology, in addition to direct circuit imaging. In these technologies, laser systems are combined with highly integrated design software and extremely accurate linear drives to be able process printed circuit panels. Electronic design data is taken on the front-end, translated into a machine-usable code, and then applied to the workpiece (panel) in a single side per cycle format. Laser focal points are now at 12.7 $\mu$m increments, enabling 25 micron feature capability. Future reductions of these focal points will improve geometry capability to the sub 25 $\mu$m area. The main advantage of using a system like the ESI 5200 YAG laser in the process of the present invention is the ability to clear both metal and epoxy features. The focal point of the laser can be adjusted using an imaging or trepanning mode that allows the amount of energy applied to the work to be uniform enough to see no degradation in line integrity.

The electronic file containing the trim line program is typically downloaded to the laser system from the CAM department. Once a "recipe" is optimized for the application (a recipe includes the amount of energy, time, and registration requirements for the particular design and material to be ablated), the process is run in an automated manner. As various types of laser technologies are currently available ($CO_2$, YAG, excimer), the recipe will be adjusted according to the process flow to be used and the equipment selected. For flexibility, a YAG laser technology is preferred because the amount of energy required to ablate through epoxy soldermask or metal (typically a 1 to 5 ratio) can be adjusted. When the short is hit with the laser energy according to the program defined by the trim line, the epoxy is cleared, exposing the short below for removal according to the chemical method described above, or else the metal short is entirely cleared. The amount of energy of the laser and quality characteristics of the customer will define the depth, accuracy, and potential damage caused by the cut.

Higher throughput generally means less accuracy and less energy applied into the cut, while a greater consistency or quality of cut can be achieved with slower throughput. For IC packaging applications it is generally desired that the amount of excess damage (superfluous energy) applied by the laser is minimized. The results of the superfluous energy can be seen in a cut trimming through the short and into (or through) the dielectric layer below, damage to the epoxy dielectric surrounding the cut, or burning of the copper on either side of the cut. Again, depending on the end quality characteristics required, these recipes are optimized for quality and efficiency.

In the case of trimming the epoxy only to expose the short, a subsequent secondary process is required. For example, if a soldermask is used as a plating resist, then cleared to expose the short, then a final etch bump can be used to remove the metallic short. This etch bump can be achieved through a number of chemistries currently used in printed circuit board processing including alkaline based chemistries, cupric chloride based chemistries, and sodium persulfate based chemistries. In all cases, the metallic copper short is exposed to agents that remove the copper while the surrounding circuits are protected by the over-coated soldermask.

In either variation, in order to improve efficiencies, the amount of copper to be trimmed or the amount of epoxy to be ablated can be minimized in order to speed up the laser etch process. In the case of copper, the foil selected or the amount of copper plated can be controlled to provide enough integrity to transmit the desired power, but otherwise minimized in order to reduce the amount of laser energy or chemical strength required to eliminate it. For epoxies the effect is less dramatic, but again the epoxy system selected and the amount applied will result in different amounts of energy required for ablation.

As a follow up process, once the short has been removed by either method, a secondary coating can be optionally applied in order to minimize exposure of the cut to the environment. In the case of IC packaging, the trim is best designed to be located within the periphery of the encapsulation or molding process performed in the subsequent assembly operation. In this operation, an epoxy coating is applied over the die and connecting wires or bumps in order to prevent environmental, handling, or other types of damage. These coatings have a low viscosity in order to help them flow over and into small geometric areas defined by the small interconnecting wires and bumps. Ideally, the trim line, when placed inside the perimeter of the area to be coated as shown in FIG. 9, is covered by the epoxy system and maintains a higher degree of integrity than when left unfilled. For conventional circuit boards, this epoxy can be substituted with soldermask.

The process of the invention provides a cost effective means for electroplating areas hereto limited by either geometric or process flow constraints. Particularly in the area of IC packaging, the invention allows for the deposition of virgin surface finish without risk of contamination or handling defects from subsequent operations. The cost-effective nature of the process arises from the savings in precious metal content and the ability to follow existing manufacturing flows. This cost savings is somewhat offset by the capital required for the laser equipment, but any long term analysis shows a significant advantage.

The invention described herein is note limited to the applications described above. Those familiar in the art may find variant applications of the benefits of using the design and laser trimming methodology described above for use in applying an electroplated finish to any circuit design. While the invention has been described with reference to the illustrated embodiment, it is not intended to limit the invention but, on the contrary, it is intended to cover such alternatives, modifications and equivalents as may be included in the spirit and scope of the invention. For example, instead of solder balls, the motherboard may be provided with pins or projections which are bought into contact with the conductive pads on the integrated circuit package. These and other modifications involving, for example, reversal of parts, are within the scope of the claims which follow.

What is claimed is:

1. A circuit board, comprising a substrate;

a dielectric layer formed directly on a surface of the substrate;

a number of electrical circuits formed on the dielectric layer;

a soldermask covering the electrical circuits but leaving electrical contact portions thereof exposed, the contact portions having a surface finish deposited thereon, wherein the electrical contact portions comprise a row of inner bond pads and a row of outer bond pads, with each circuit extending between an inner bond pad and an outer bond pad; and a series of spaced-apart, conductive bus segments disposed end to end at a location between the row of inner bond pads and the row of outer bond pads, each circuit intersecting a bus segment.

2. The circuit board of claim 1, wherein the circuits consist essentially of copper, the substrate consists essentially of copper, and the surface finish consists essentially of one or more metals selected from the group consisting of nickel, gold, silver and palladium.

3. The circuit board of claim 1, further comprising an integrated circuit die mounted on a central portion of the substrate such that the bus segments form a ring-shaped formation that surrounds the integrated circuit die, and wherein the row of inner bond pads is disposed between the die and the ring.

4. The circuit board of claim 1, wherein the bus segments are spaced apart by laser ablations.

5. The circuit board of claim 1, wherein the inner bond pads comprise fingers having the surface finish deposited on a top and opposing side surfaces thereof.

6. A circuit board intermediate structure, comprising a substrate having an outwardly opening inner cavity and a top surface surrounding the inner cavity;

a dielectric layer formed on the top surface of the substrate;

inner electrical contacts formed on the dielectric layer proximate the inner cavity;

outer electrical contacts formed on the dielectric layer remote from the inner cavity;

a plurality of electrical circuits formed on the dielectric layer including a plurality of thin, elongated, spaced conductors extending between an inner contact and an outer contact, each of the conductors extending outwardly from the inner cavity of the substrate; and a bus electrically interconnecting each of the conductors, wherein the bus extends continuously around the inner cavity intersecting the conductors and is substantially orthogonal to each of the conductors.

7. The circuit board intermediate structure of claim 6, further comprising:

a soldermask covering the electrical circuits but leaving electrical contact portions thereof exposed, the contact portions having a surface finish electrolytically deposited thereon using the bus.

8. The circuit board intermediate structure of claim 6, wherein the inner contacts comprise a row of spaced wire bonding pads, and the outer contacts comprise a row of spaced ball pads configured for attachment of solder balls thereto.

9. The circuit board intermediate structure of claim 8, further comprising a soldermask covering the electrical circuits but leaving the bonding pads and ball pads thereof exposed, the contact portions having a surface finish electrolytically deposited thereon using the bus.

10. The circuit board intermediate structure of claim 9, wherein the circuits consist essentially of copper, the substrate consists essentially of copper, and the surface finish consists essentially of one or more metals selected from the group consisting of nickel, gold, silver and palladium.

* * * * *